United States Patent
Bogdanov (10) Patent No.: US 9,860,640 B2
(45) Date of Patent: Jan. 2, 2018

(54) AMPLIFIER AND FREQUENCY RESPONSE CORRECTION METHOD

(71) Applicant: Alexander Yakovlevich Bogdanov, Moscow (RU)

(72) Inventor: Alexander Yakovlevich Bogdanov, Moscow (RU)

(73) Assignee: Alexander Yakovlevich Bogdanov, Moscow (RU)

( * ) Notice: Subject to any disclaimer, the term of this patent is extended or adjusted under 35 U.S.C. 154(b) by 121 days.

(21) Appl. No.: 14/436,887

(22) PCT Filed: Sep. 27, 2013

(86) PCT No.: PCT/RU2013/000851
§ 371 (c)(1),
(2) Date: Apr. 18, 2015

(87) PCT Pub. No.: WO2014/062085
PCT Pub. Date: Apr. 24, 2014

(65) Prior Publication Data
US 2015/0249888 A1    Sep. 3, 2015

(30) Foreign Application Priority Data
Oct. 19, 2012    (RU) ................. 2012144399

(51) Int. Cl.
*H03G 5/00*       (2006.01)
*H04R 3/04*       (2006.01)
*H03F 3/181*      (2006.01)
*H03F 3/45*       (2006.01)

(52) U.S. Cl.
CPC ............... *H04R 3/04* (2013.01); *H03F 3/181* (2013.01); *H03F 3/45475* (2013.01); *H03F 2200/411* (2013.01); *H03F 2203/45512* (2013.01); *H03F 2203/45528* (2013.01)

(58) Field of Classification Search
CPC ................. H03F 3/181; H03F 3/45475; H03F 2203/45512; H03F 2203/45528; H03F 2200/411; H04R 3/04
USPC ....... 381/98, 99, 101, 120, 102, 28, 121, 96; 330/75, 85, 251, 207 A, 104, 103, 146
See application file for complete search history.

(56) References Cited

U.S. PATENT DOCUMENTS

| | | | |
|---|---|---|---|
| 4,052,560 A | 10/1977 | Santmann | |
| 4,118,600 A | 10/1978 | Stahl | |
| 5,313,525 A | 5/1994 | Klasco | |
| 2004/0125962 A1 | 7/2004 | Christoph | |

FOREIGN PATENT DOCUMENTS

| | | | |
|---|---|---|---|
| RU | 2111732 | * | 5/1998 |
| RU | 2326495 | * | 6/2008 |

* cited by examiner

*Primary Examiner* — Vivian Chin
*Assistant Examiner* — Con P Tran (57) ABSTRACT

The invention relates to amplifiers of audio power which operate with loudspeaker systems. The main technical result is significant extension of the reproducible frequency range without reduction of the loudspeaker system fundamental resonance frequency. This result can be obtained by means of adding only one low power resistor and one low capacitance capacitor to a typical power amplifier. In the described embodiment this is achieved by means of a rise of the amplifier FR at low frequencies using positive feedback and the quasi-resonance effect.

4 Claims, 9 Drawing Sheets

FIG. 16

AMPLIFIER AND FREQUENCY RESPONSE CORRECTION METHOD

TECHNICAL FIELD

The present invention relates to electrical amplifying equipment and, more particularly, to audio power amplifiers which are loaded onto loudspeaker systems.

BACKGROUND OF THE INVENTION

It is common knowledge that the most complicated technical problem in electric loudspeaker systems is reproduction of sound at the lowest frequencies. In the vast majority of cases electrodynamic radiators are used as radiators at low frequencies. In such radiators a dramatic drop of sound pressure frequency response (FR) takes place at frequencies lower than the fundamental resonance frequency which is accounted for by their physical principles of operation. This is particularly topical in small-size loudspeaker systems where the diameter of the radiator diffuser and the dimensions of the loudspeaker system are confined within strict limits. These limits do not allow creating a loudspeaker system with the fundamental resonance frequency which would be sufficiently low.

One of possible solutions to this problem has been suggested in "Loudspeaker distortion reduction systems" patent, U.S. Pat. No. 4,052,560, John Bryant Santmann, Oct. 4, 1977. This patent suggests that a low-pass filter (LPF) should be introduced before the power amplifier. The LPF provides a rise of the amplifier FR and is able to compensate for the drop of the loudspeaker system sound pressure FR at low frequencies completely. The main disadvantage of this method is an excessive correction at the lowest frequencies. A specific feature of most low-frequency electro-acoustic transducers is their extremely low efficiency at frequencies that are more than 2.5-3 times lower than the cutoff frequency. Deep correction of the amplifier FR is not efficient at these frequencies; it results in a high level of non-linear and transient distortions and limits the actual maximum power of the loudspeaker system significantly. Therefore, this method of correction can be used for loudspeaker systems whose initial cutoff frequency does not exceed 60-70 Hz (it is assumed that the actual sound signal does not have any components with a considerable level at frequencies below 25-30 Hz). Most small-size loudspeaker systems do not meet these requirements. Another disadvantage is the necessity of introducing additional amplifying elements of the integrator which are to provide a rise of the amplifier FR 12 dB/octave and more to form FR which is close to the horizontal sound pressure FR. This sophisticates the amplifier and increases its cost.

Another well-known solution to the problem of low frequency reproduction is the use of acoustic transducer current positive feedback (PFB) in the power amplifier. This PFB produces negative output impedance of the amplifier and is able to provide a rise of the FR at low frequencies by means of introducing a low-pass filter into the PFB circuit. This idea can be implemented in numerous ways involving different frequency correction circuits and different quantity of amplifying elements. There is an arrangement similar to the claimed invention. It is described in "Acoustic apparatus with secondary quarterwave resonator" patent, U.S. Pat. No. 5,313,525, Michael A. Klasko, May 17, 1994, FIG. 18, p. 11. The main disadvantage of this circuit is the fact that the rise of the amplifier FR has low steepness and the correction depth is limited by the system stability conditions. This does not allow achieving any substantial extension of the FR horizontal area.

Another method of correction at low frequencies is provided in "Loudspeaker lower bass response using negative resistance and impedance loading" patent, U.S. Pat. No. 4,118,600, Karl Erik Stahl, Oct. 3, 1978. This solution is based on an amplifier with significant active negative output impedance and a considerable proportion of reactive output impedance which changes the speaker equivalent characteristics (e.g. the movable system equivalent mass) for the purpose of considerable extension of the range of reproducible low frequencies. A disadvantage of the system is that the rise of the reproduction level at frequencies below the loudspeaker system fundamental resonance frequency is accompanied by deterioration of reproduction at higher frequencies. Another disadvantage is a need for additional amplifying elements.

SUMMARY OF THE INVENTION

Figure 1:
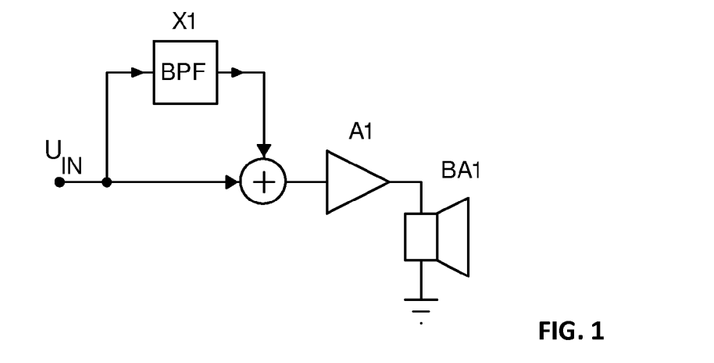
FIG. 1 A functional diagram of the amplifier in accordance with the invention.

The functional diagram of the amplifier in accordance with the claimed invention is shown in FIG. 1. Here, X1 is a band-pass filter which provides the required rise of the amplifier FR. A1 is an amplifier loaded onto the loudspeaker system (BA1). The selected medium frequency of the band-pass filter is significantly lower than the loudspeaker system cutoff frequency as per sound pressure at low frequencies. The level of correction provided by the band-pass filter allows extending the sound pressure FR horizontal area to approximately the band-pass filter medium frequency.

The technical result of using the band-pass filter for FR correction is as follows:

1) Extension of the linear sound pressure FR in the low frequency region more than 2.5 times. The lower limit of the reproducible frequency range of 20 Hz can be achieved in small-size loudspeaker systems. In particular, this allows doing without big-size loudspeaker systems and subwoofer speakers in household loudspeaker systems and systems used in relatively small spaces.

2) The rise of FR is followed by a steep drop at the lowest frequencies. This is optimal with regard to the loudspeaker efficiency.

3) Extension of the range of reproducible low frequencies can be implemented at any output impedance of the amplifier at low frequencies: negative, close to zero or positive one. As a result, the invention can be used with electro-acoustic transducers of any type. The value and nature of the transducer impedance are not critical for achieving the claimed technical result.

4) Positive feedback can be used to adjust the band-pass filter quality. The FR rise steepness of the band-pass filter with PFB accords well with steepness of FR drop in typical loudspeaker systems. This allows doing without additional amplifying elements in lots of cases.

5) Minimum quantity of additional amplifier elements. In order to achieve the claimed technical effect one low power resistor and one low capacitance capacitor need to be added to a conventional power amplifier.

It should be noted that creation of a radiator with power allowance is a relatively simple technical problem which has well-known solutions. Besides, in order to obtain less non-linear distortions loudspeaker systems usually have significant power allowance and are seldom used at power which is close to maximum. At the same time, reduction of the loudspeaker system fundamental resonance frequency bumps against basic physical characteristics such as the weight and flexibility of the radiator movable system as well as air resilience inside the loudspeaker system. Any significant change in these characteristics is impossible with a specified diffuser diameter and loudspeaker system dimensions. The claimed invention allows solving basic problems of low frequency reproduction to a large extent without reducing the loudspeaker system fundamental resonance frequency.

Apart from the extension of the range of reproducible low frequencies, the invention allows achieving the following technical results (the specified technical capabilities can be used separately or in combination, with the appropriate distribution of the technical effect):

1) Reduction of the loudspeaker dimensions by several times without narrowing the range of reproducible low frequencies. The depth of the FR correction in the suggested amplifier is sufficient to reduce the size of the loudspeaker system enclosure to the size of a radiator while preserving a sufficient low frequency limit of the reproducible range. This allows using a manufacturing method wherein the loudspeaker system enclosure has dimensions close to geometrical dimensions of the electro-acoustic radiator. It can be manufactured simultaneously with the electro-acoustic radiator enclosure and be a structural element of the radiator itself. For such a loudspeaker system the technical result is the absence of the need for any additional acoustic design when using it. A loudspeaker system of this kind is able to operate in open spaces or be installed into an electronic device body. In order to decrease the air resilience inside such a loudspeaker system at low frequencies, different variants of acoustic impedance are installed in the loudspeaker system enclosure behind the diffuser, or a phase inverter is used, for example a phase inverter with an output slit around the diffuser. In this radiator construction the diffuser holder is at the same time a part of the phase inverter.

2) The use of the dynamic radiator with a lighter diffuser or a more rigid suspension (and a higher reproducible high frequency and better transient response, but with a higher fundamental resonance frequency) without narrowing of the range of reproducible low frequencies.

In a typical embodiment, the band-pass filter consists of a low-pass filter and a high-pass filter (HPF). A typical power amplifier usually comprises a separating capacitor at the input and/or output which is an HPF. The presence of the separating capacitor at the amplifier output is compulsory when single supply is used, and allows increasing the amplifier reliability as compared to an amplifier without a separating capacitor. On the other hand, the separating capacitor limits the level of low frequencies and deteriorates the loudspeaker system electric damping. The invention suggests that a separating capacitor should be used as a band-pass filter element. This allows achieving a beneficial effect which is exactly opposite to the said disadvantages: extension of reproducible low frequencies and improvement of radiator damping.

Although the invention allows achieving the technical result by means of adding a few passive components only to a conventional power amplifier, it does not preclude adding some additional amplifying elements to the circuit. This does not change the essence of the invention. For example, amplifiers with higher power can have insufficient depth of PFB in the current sensor with maximum allowed value of the resistor. In this case, an amplifier can be added into the PFB circuit (as shown in U.S. Pat. No. 5,313,525 patent mentioned above).

The type of the power amplifier is not critical for the present invention either. Powerful operational amplifiers, amplifier bridge circuits, amplifiers without differential inputs, composite amplifiers or amplifiers of other classes, for example, those of class D, can be used as amplifiers. The invention does not preclude the use of transformers in signal circuits either.

Since simple signal processing elements (LPF, HPF, addition/subtraction, transfer factor adjustment) are used in the amplifier under consideration, the claimed invention can be embodied using digital signal processing. Digital embodiment of the said elements is well-known.

The method of FR correction considered in the invention can be used with loudspeaker systems which have different acoustic design. The main application field comprises systems which reproduce low frequencies: broadband, multiband or those intended for reproduction of low frequencies only. In particular, these can include closed type speakers or those having phase inverters, acoustic baffles, earphones of different types as well as electro-acoustic radiators installed in bodies of radioelectronic devices without special acoustic design. Dynamic radiators or other types of radiators can be used as loudspeaker system radiators.

The type of acoustic design is not critical either. A closed loudspeaker system or phase inverter are not the only ones possible. The possibility of raising the amplifier FR does not depend on the radiator acoustic design.

When a phase inverter is used, the optimal ratio of bandpass filter medium frequency and phase inverter resonance can vary depending on the acoustic design, radiator parameters, requirements for FR ripple to the range of the reproducible low frequencies, non-linear distortions or may depend on other factors. Resonance frequency of the phase inverter can be higher, lower or equal to the bandpass filter resonance frequency.

Thus, the amplifier and the method of extension of the range of reproducible low frequencies considered in this invention are simple, multipurpose, extremely cheap and efficient.

In a more general case, the invention can be used not only in the lowest audio frequency regions and/or not only with acoustic systems. The proposed quasi-resonance effect does not depend on electric characteristics of the load and can be achieved at other frequencies and with other types of loads.

DESCRIPTION OF THE DRAWINGS

FIGS. 2 (A), 2 (B). A Wien bridge based amplifier.

FIGS. 5 (A), 5 (B). An amplifier with a capacitor connected in series with the load.

DETAILED DESCRIPTION OF THE INVENTION

Figure 2:
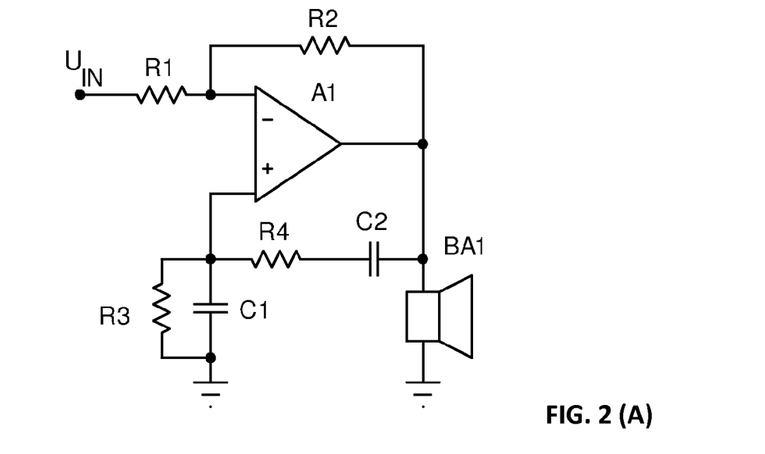

A variation of the amplifier embodiment in accordance with the claimed invention is shown in FIG. 2*a*. A powerful operational amplifier A1 is used as the amplifying element here. It is loaded onto the loudspeaker system with a radiator BA1. The amplifier is embraced by frequency-independent negative feedback (NFB) via resistors R1 and R2. The positive feedback (PFB) circuit consists of a band-pass filter (HPF and LPF connected in series) which comprises elements C1, C2, R3, R4. This circuit is well-known as Wein bridge and is usually used in low frequency oscillators. In the present invention this circuit is used as an amplifier which is loaded onto an electro-acoustic transducer and has a special FR setting. Parameters of feedback circuits have been selected based on sufficient stability of the amplifier. This means that oscillatory processes that may occur (for example, as a result of transient processes) are damped. The selected frequency band-pass filter quasi-resonance frequency is significantly lower than the loudspeaker system cutoff frequency at low frequencies. The amplification factor at medium and high frequencies is determined by the NFB circuit. The FR correction depth depends on the ratio of the positive and negative feedback. The PFB provides the amplifier FR rise relative to medium frequencies while preserving sufficient stability of the amplifier. The required level of correction at low frequencies is usually achieved at similar transfer factors of dividers R1, R2 and R3, R4 (excluding the case described below where the HPF cutoff frequency is higher than the LPF cutoff frequency).

Considering the fact that a typical power amplifier has output impedance which is close to zero, there is a diagram in FIG. 2*b* equivalent to that in FIG. 2*a*. Here, the band-pass filter is assembled on an individual amplifying element A1. A2 is a output power amplifier. Therefore, the amplifier according to the claimed invention can both form a band-pass filter and comprise a separate element of the band-pass filter.

Figure 3:
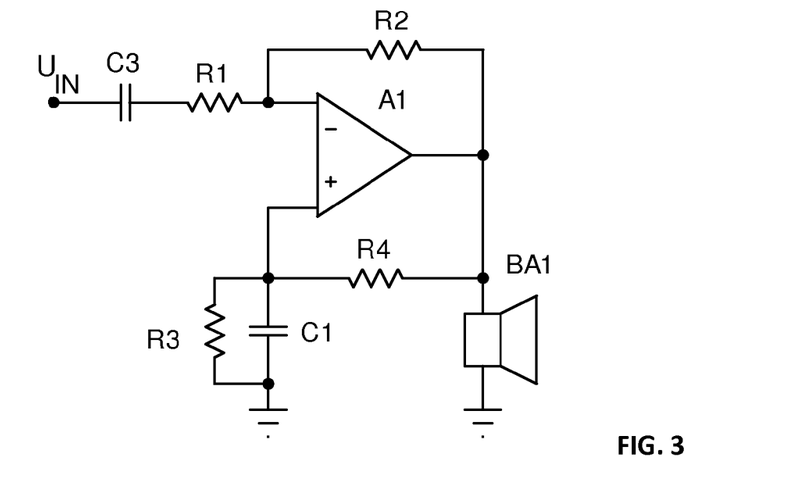
FIG. 3. An amplifier embodiment with a minimum quantity of additional elements.

FIG. 3 shows another variation of the invention embodiment. In this diagram the band-pass filter is embodied as a combination of an LPF in a PFB circuit and an HPF in an NFB circuit. The HPF is formed by the input separating capacitor C3. Considering the fact that the separating capacitor at the input is an obligatory element of most conventional power amplifiers, this circuit comprises only two additional elements as compared to a conventional amplifier: a low power resistor R4 and a capacitor of low capacitance C1. In this case, the capacitor C3 can have a considerably lower value as compared to the typical value. The circuit operates in the similar way to that shown in FIG. 2*a*, FIG. 2*b*. The amplification factor at medium and high frequencies is often specified by resistors R1 and R2. The required level of correction at low frequencies is usually achieved at similar transfer factors of dividers R1, R2 and R3, R4 (excluding the case described below where the HPF cutoff frequency is higher than the LPF cutoff frequency).

Figure 4:
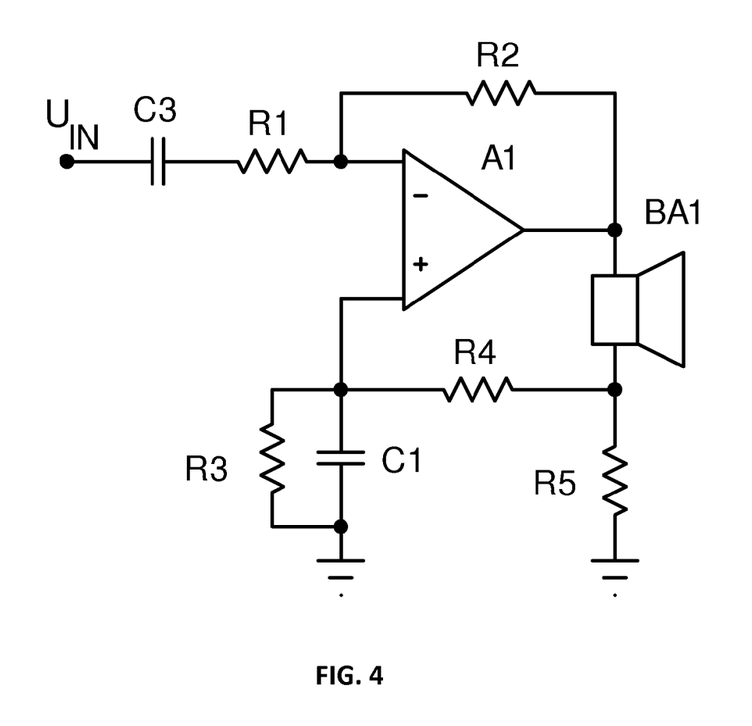
FIG. 4. An amplifier with current through load PFB.

The present description deals with two types of PFB: output voltage PFB and current through load PFB. The circuits in FIG. 2*a*, FIG. 2*b* and FIG. 3 illustrate the use of the output voltage PFB. The current through load PFB is shown in FIG. 4. Here, the resistor R5 is a detector of current through the load. Its value is considerably lower than the load impedance. The voltage in the resistor R5 is proportional to the current through the load. In this circuit the dividing factor of the divider BA1, R5, is of paramount importance. The lower the R5 value, the higher is the amplification factor of the amplifier at which the required level of correction can be achieved. In all other respects this circuit is similar to that in FIG. 3.

Figure 5:
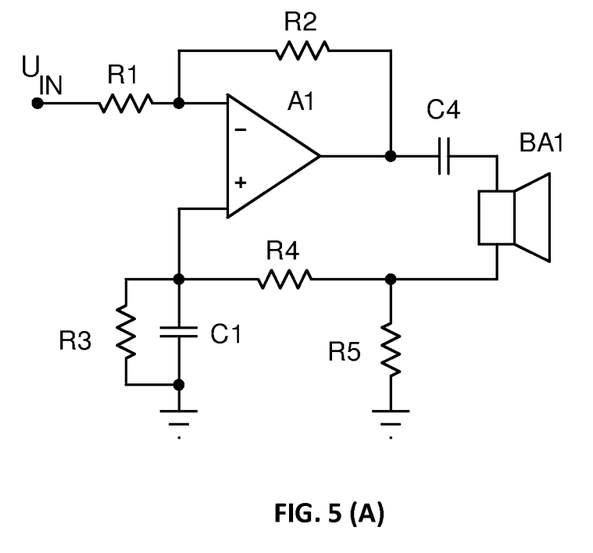

FIG. 5*a* shows an amplifier where functions of the HPF are performed by the capacitor C4 which is connected at the amplifier output in series with the load. This circuit is similar to that in FIG. 4 and as at the same time is a modification of the Wein bridge. FIG. 5*b* shows an amplifier with an additional NFB loop through the resistor R6 which embraces the output capacitor. This feedback allows decreasing the capacitance of the capacitor C4 without reducing the band-pass filter resonance frequency.

Figure 6:
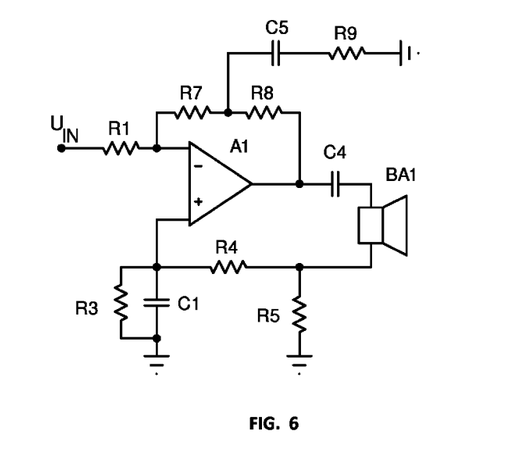
FIG. 6. An amplifier with LPF between the output and the inverting input.

One more variation of the HPF based on the NFB is shown in FIG. 6. Here, an HPF based on the capacitor C5 is introduced between the amplifier output and the amplifier inverting input. The amplification factor of the amplifier at medium and high frequencies is governed by the T-shape circuit R7, R8, R9 and the resistor R1. In all other respects this amplifier operates similarly to those shown above.

All shown amplifiers have similar FR when adjusting feedback circuits in accordance with the invention. They also have the phase-frequency characteristic typical for a resonance system with a zero phase shift at a frequency close to the resonance frequency (180° for the inverted amplifier), with a phase advance at frequencies somewhat lower than the resonance frequency and with a phase delay at frequencies somewhat higher than the resonance frequency.

Figure 7:
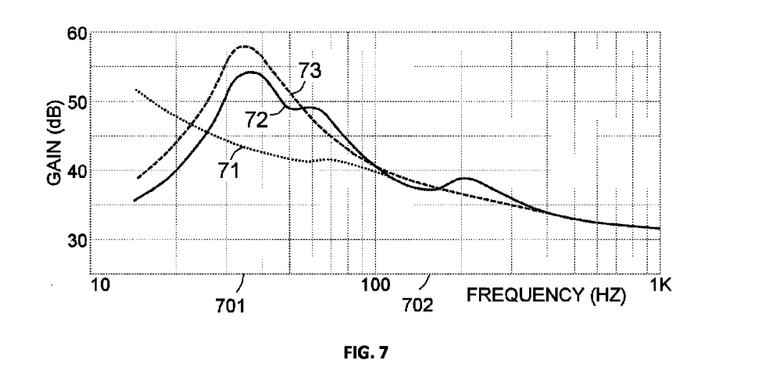
FIG. 7 Output voltage FR graphs.

The FR for the output voltage of the amplifiers under consideration is illustrated by graphs in FIG. 7. They show the FR of amplifiers obtained experimentally at the PFB maximum depth which is limited by stability conditions at low frequencies. Designing of amplifiers using Spice-models accords well with the experimental results. A direct radiation dynamic driver is used as an electro-acoustic transducer in the acoustic design with a phase inverter. The curve 71 shows the FR of the amplifier which is provided in the above mentioned U.S. Pat. No. 5,313,525 patent (with current through load PFB which comprises an LPF). The curve 72 shows the FR of the amplifier in accordance with the invention for the current through load PFB (circuits in FIG. 4-6). The curve 73 shows the FR of the amplifier in accordance with the invention for the output voltage PFB (circuits in FIG. 2*a*, FIG. 2*b*, FIG. 3). Here, 702 is the frequency of the loudspeaker system fundamental resonance. 701 the band-pass filter resonance frequency.

The curves 72, 73 in FIG. 7 differ from the curve 71 in the following way:

1) They have twice as high steepness of the FR rise at a frequency lower than the radiator fundamental resonance frequency (the area between the frequencies 702 and 701). The obtained steepness accords well with the drop of the loudspeaker system sound pressure FR and is sufficient for extension of the FR horizontal area as per sound pressure up to the 701 frequency.

2) The maximum rise of the FR in the sound range is higher by the absolute value (two or more times higher at maximum) and takes place at frequencies where the radiator has a relatively low efficiency loss.

3) A steep drop of the FR at frequencies lower that the 701 frequency is provided.

The said differences allow achieving the main technical effect: considerable extension of the AFR horizontal area as per sound pressure while preserving rather high efficiency of the loudspeaker system.

The 701 frequency (FIG. 7) is referred to as the amplifier resonance frequency in the description. It is implied that when the current through load PFB is used, the load impedance can have a certain influence on this frequency. At the same time, a similar technical result can be achieved at different load impedances. This can only require another selection of values for elements of the amplifier feedback circuits.

Figure 8:
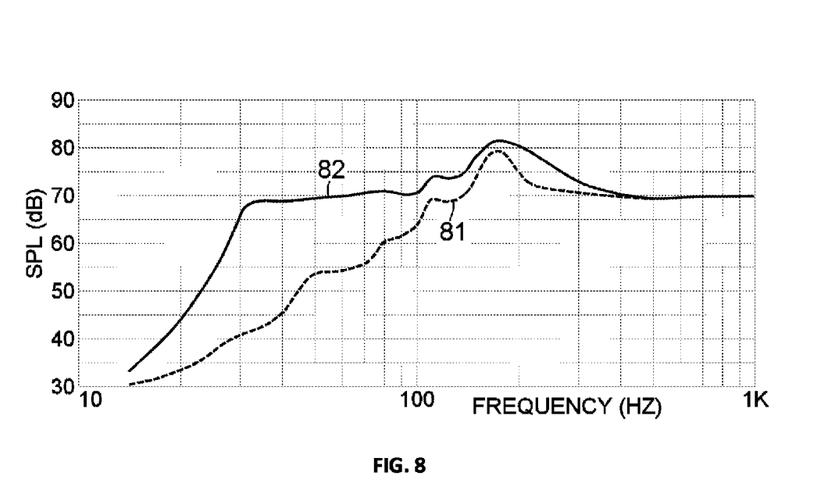
FIG. 8. Sound pressure FR graphs.

FIG. 8 illustrates the achieved technical effect in sound pressure FR graphs. The curve 81 shows the FR when operating with a linear amplifier with zero output impedance. The curve 82 shows the FR when operating with an amplifier according to the diagram of FIG. 4. A simple direct radiation dynamic driver of the initial class 10 cm in diameter and with impedance of 6 ohm is installed in the loudspeaker system. The amplifier of FIG. 4 has the following values of elements: R1=5.3 Kohm, R2=330 Kohm, R3=91 Kohm, R4=10 Kohm, C1=0.1 µF, C3=4.4 µF, R5=0.16 ohm, and the PFB signal is taken from the trimming resistor which is connected in parallel to R5 (not shown in the diagram). The graphs show that when the present invention is used, the loudspeaker system with the fundamental resonance frequency 170 Hz reproduces frequencies starting with 30 Hz efficiently. This corresponds to the three-fold extension of the range of reproducible frequencies. The frequency of 20 Hz at the mid-frequency level has been experimentally achieved in a conventional small-size loudspeaker system with a speaker of 13 cm in diameter. The said experimental results are provided for simple loudspeaker systems and do not limit the invention. The use of additional engineering solutions allows improving these results significantly without changing the essence of the invention. The claimed technical result is relative and is not expressed in specific values of frequencies.

In the diagrams provided in the description, capacitors are used as elements with frequency dependent characteristics. The use of RC circuits only is not compulsory for the invention. The invention can be implemented with LC circuits, with electronic equivalents of reactive impedance or with the use of digital signal processing in any combination. Therefore, the terms "resonance frequency", "quasi-resonance frequency" and "band-pass filter medium frequency" are regarded as synonyms in this description. The provided variations of the band-pass filter are not exhaustive. There are a lot of other arrangements. The circuit design of the band-pass filter is not crucial for this invention. Higher order filters which comprise more than one element with frequency dependent characteristics can be used apart from the first order filters.

Figure 9:
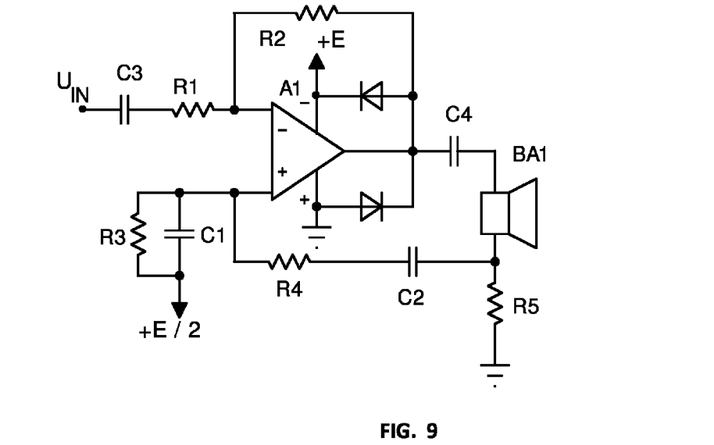
FIG. 9. An amplifier with unipolar power supply.

The diagrams shown above do not comprise any power supply circuits. They require typical bipolar power supply. In all other respects these circuits are completely functional. The polarity of power supply is not significant for this invention. All circuits of this description can be modified in an obvious manner for the use of single or bipolar power supply. FIG. 9 shows a variation of the invention embodiment with the use of single supply. All capacitors in this circuit can influence the amplifier resonance frequency. Depending on which capacitor is determining, this circuit can be equivalent to the relevant circuit of those provided above. Combining is also possible. The general strategy of selection of element values can involve the initial choice of C4 and R5 values. The capacitance of the capacitor C4 is usually at least two orders higher of the capacitance of all other capacitors. Its value should be reasonably high. Reduction of this capacitance and related increase in the reactive impedance of the capacitor can result in inefficient use of the power supply voltage at the lowest frequencies and an increase in non-linear distortions. The value of the resistor R5 is determining for the amplification factor of the amplifier at medium and high frequencies. If the amplification factor is too high at an acceptable value of R5, a resistive voltage divider can be used at the amplifier input. This divider can additionally reduce the impact of the signal source resistance. The cutoff frequency of the LPF in the PFB circuit (R4, C1) is selected based on obtaining the horizontal sound pressure FR. A higher cutoff frequency allows achieving emphasized reproduction of low frequencies. Values of other capacitors are selected based on obtaining required amplifier resonance frequency.

Figure 10:
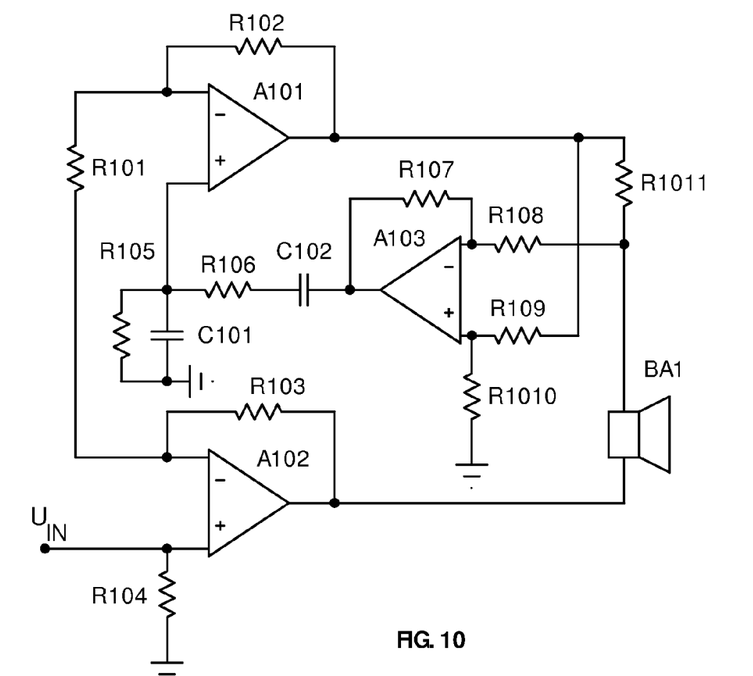
FIG. 10. A bridge amplifier.

A possible variation of the amplifier bridge circuit in accordance with the claimed invention is shown in FIG. 10 (bridge amplifiers are usually used to obtain higher output power with low power supply voltage, for example, in portable or vehicle equipment or with power supply from a computer USB-port). In this circuit, the amplifiers A101 and A102 form a bridge power amplifier. A differential amplifier generating a current through the load PFB signal, is assembled of the amplifier A103 and resistors R107, R108, R109, R1010. The elements R105, C101, R106, C102 form a band-pass filter. The NFB circuit is formed by the resistors R101, R102 and R103. The NFB depth can be adjusted by means of changing the value of the resistor R101. This circuit operates similarly to that of FIG. 2a, FIG. 2b (with the current through load PFB). The circuit of FIG. 10 can be modified in an obvious manner for the use of single supply.

The present invention deals with two types of PFB: output voltage PFB and current through load PFB. The amplifier with output voltage PFB has output impedance which is close to zero. The amplifier with current through load PFB has significant negative output impedance at frequencies close to the amplifier resonance frequency. In most circuits provided, the use of only one type of PFB is shown. Nevertheless, if the necessity of current PFB is not declared, circuits can be modified in an obvious manner for the use of any type of amplifiers. The PFB type selection is greatly dependent on the radiator type and conditions of the amplifier use.

The main advantage of output voltage PFB is low dependence of FR and amplifier amplification factor on the load impedance. This variation is preferable if the amplifier is to operate for loads having different impedances. Another advantage of output voltage PFB is a somewhat higher maximum level of FR correction while preserving stability and somewhat higher additional amplification area at low frequencies.

When operating for an electrodynamic radiator with certain impedance, in most cases it is preferable to use current through load PFB. Its main advantage is better damping of the loudspeaker system. Moreover, reduction of linear and non-linear distortions can be achieved in a number of cases. Another advantage of current PFB is significant automatic control of the correction level depending on the load active impedance. One of specific features of the circuits under consideration is the fact that with a high FR correction level a slight change of the active impedance results in a significant reduction of the correction level. For example, an increase in impedance by 20% due to heating of the voice coil can cause two-fold decrease in the correction level at the amplifier resonance frequency. This increases reliability when the radiator operates at a power close to maximum one and limits the level of possible self-oscillation, for example, when adjusting the amplifier.

In general, the method of the FR correction considered in the invention can be used in amplifiers with any output impedance. For example, the amplifier A2 in FIG. 2b can have any output impedance.

Figure 11:
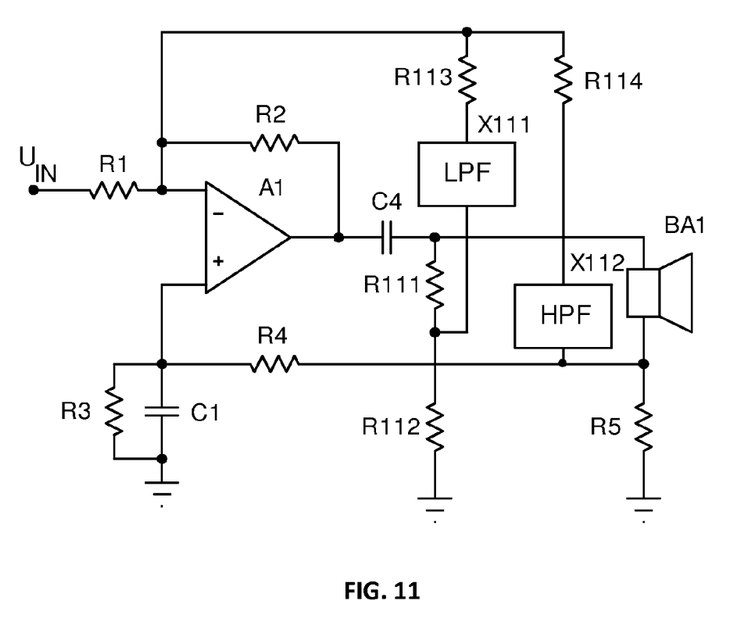
FIG. 11. An amplifier with variable output impedance.

If the amplifier is loaded onto a broadband dynamic radiator, a high level of the low frequency signal can cause an increase in intermodulation distortions at high frequencies due to the inductive component of the driver impedance. Therefore, positive inductive output impedance can be optimal at high frequencies, which allows reducing intermodulation distortions. At the same time, at medium frequencies the use of an amplifier with the output impedance close to zero is preferable for efficient damping of local resonances and better control of current through the radiator. Besides, filters of multi-band loudspeaker systems work at medium frequencies. They are usually designed based on zero output impedance of the amplifier. The present invention suggests the use of the amplifier which has negative output impedance at low frequencies, output impedance close to zero at medium frequencies and positive inductive impedance at high frequencies for optimal adjustment. The technical result of this solution involves nearly optimal coordination of the loudspeaker system and the amplifier as well as flexibility allowing the amplifier to operate both for a multi-band loudspeaker system and a loudspeaker system with a broadband radiator. A circuit where this idea is implemented is provided in FIG. 11. In this diagram, the PFB circuit on the elements R3, R4, R5, C1 provides negative output impedance at low frequencies in accordance with the present invention. The voltage NFB circuit through the LPF X111 provides output impedance which is close to zero at medium frequencies. At high frequencies the depth of this NFB drops and the current through LPF X112 NFB circuit starts playing the leading part. This NFB circuit generates output positive inductive impedance of the amplifier.

Figure 12:
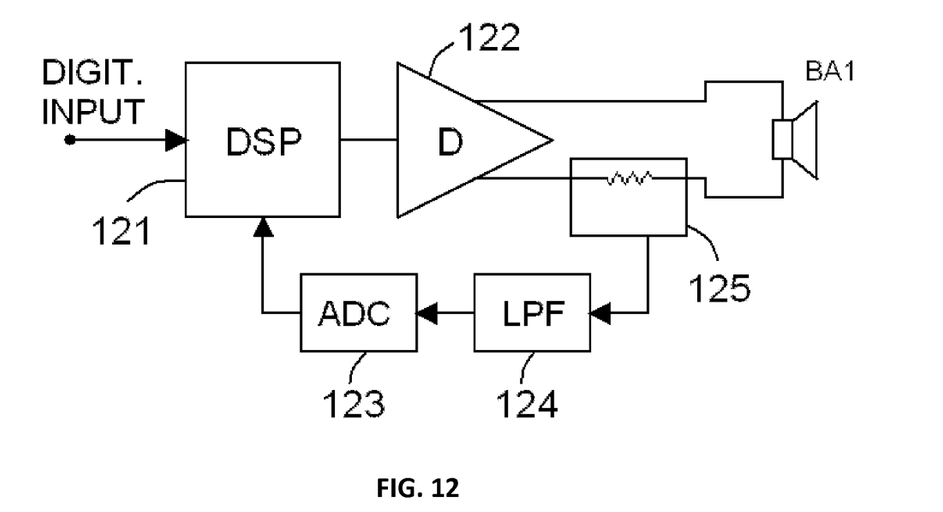
FIG. 12. An embodiment with a class D amplifier and digital signal processing.

The claimed invention is based on elements of simple linear signal processing: LPF, HPF, addition, measuring and changing of the level. All these elements are well-known and can be easily embodied in digital devices. Therefore, the claimed method of FR correction can be implemented using digital signal processing. Since the amplifier operates in the low frequency range, no high requirements are set for the operational speed of the digital device. This can be a special-purpose or general-purpose processor. A possible embodiment of the amplifier with a digital input and the use of digital signal processing is shown in FIG. 12. Here, 121 is a digital processor, 122 is a class D amplifier, 125 is a current detector which generates the current through load PFB signal (in the simplest case, a resistor with the value which is considerable lower than the load impedance), 123 is an analog-digital converter (ADC), and 124 is an LPF. The LPF allows reducing the operational speed requirement for the ADC and is an element of the band-pass filter at the same time. In general, the LPF of the band-pass filter can be embodied in the digital processor. All amplifier circuits in this description with the current through load PFB can be implemented in an obvious manner as a functional code in the digital processor.

One of the aspects of FR deep correction at low frequencies is a high probability of the amplifier overloading at a high level input signal. As it has been noted above, the amplifier FR correction level depends on the NFB and PFB ratio in the provided embodiments. Therefore, the FR correction value can be controlled depending on the signal level by means of changing the depth of PFB and/or NFB.

Figure 13:
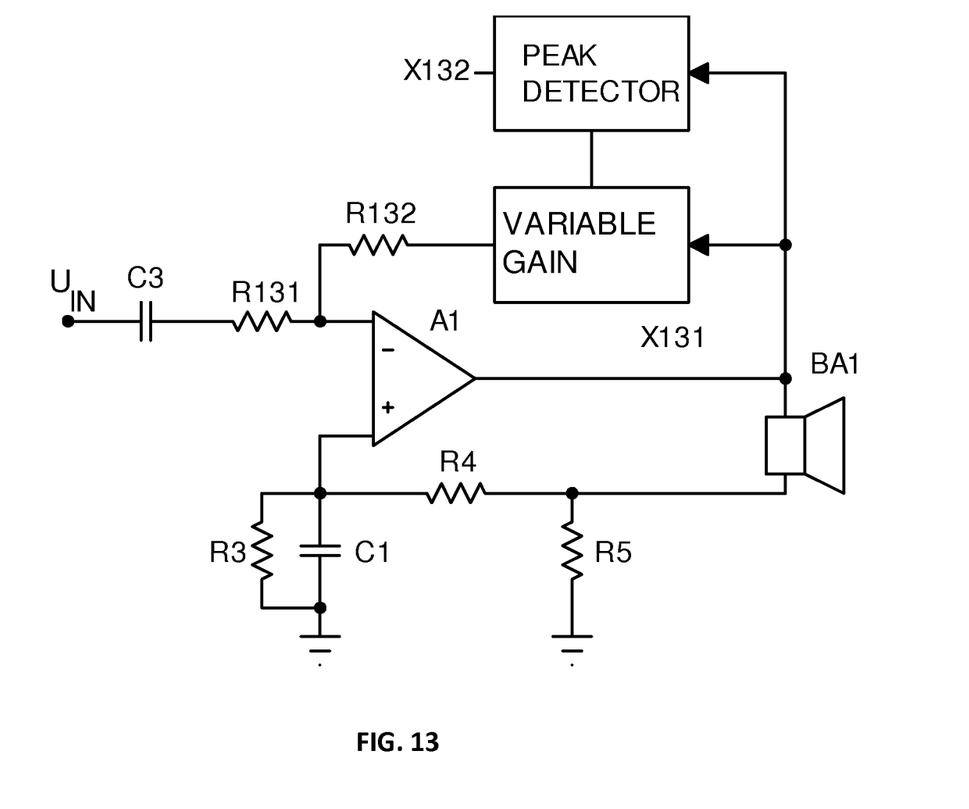
FIG. 13. An amplifier with adjustment of the NFB depth depending on the output signal.

An example of an amplifier with NFB depth control depending on the output signal is shown in FIG. 13. In this diagram the device X131 has a controllable variable transfer factor. The rectifier X132 rectifies and smoothes the control signal. An increase in the NFB depth when the output signal exceeds a certain level simultaneously with reduction of the general amplification factor decreases the depth of frequency correction. Due to non-linear dependence of the correction level on PFB to NFB ratio, the limitation takes place mainly at low frequencies first. If the output spectrum signal comprises few low-frequency components, the entire spectrum is limited. In this case, the signal for control can be taken either from the amplifier output or from the current feedback resistor R5 (not shown in the diagram). In the first case, the signal is suitable for direct detection because the limitation level is known to be higher than one volt. In the second case, amplification of the control signal can be necessary. Another disadvantage of taking the signal from the resistor R5 is reduction of sensitivity at the fundamental resonance frequency of the radiator due to growth of its impedance, apart from the fact that this is the frequency where the probability of the radiator overload is the highest.

Since the correction level in the diagram of FIG. 13 depends on the NFB to PFB depth ratio, the adjusted element can be included into the PFB circuit or both circuits can comprise the adjusted element. Unlike NFB regulation, during PFB regulation the amplification factor remains constant at medium and high frequencies.

Figure 14:
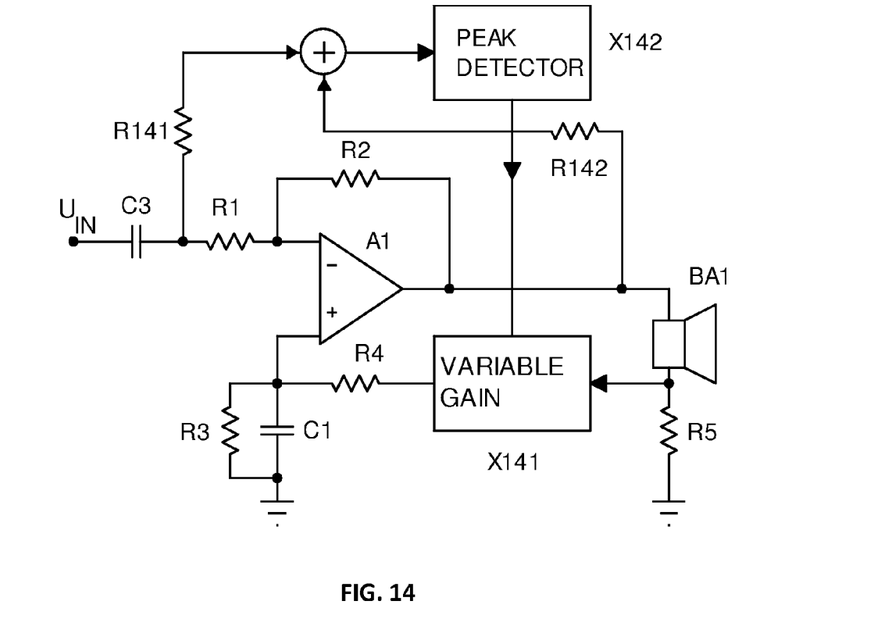
FIG. 14. An amplifier with PFB depth adjustment.

Embodiment of the amplifier with PFB depth control depending on the difference between input and output signal is shown in FIG. 14. Here, the element with the adjustable transfer factor X141 in included into the PFB circuit. A specific feature of this circuit is the fact that the difference between the input and output signals is used as the control signal. The differential signal is detected and averaged by the detector X142. The signal obtained controls the device with the variable transfer factor X141 in the PFB circuit. During addition, the ratio of the input to output signals can be selected so that the control signal at medium and high frequencies is reduced as much as possible. Firstly, this allows increasing the accuracy of control because the PFB circuit comprises an LPF and PFB depth control mainly influences FR correction at low frequencies. Secondly, this control method is much more sensitive to the signal which is present at the amplifier output but is absent at the input. This may be a signal of possible parasitic self-oscillation at the amplifier resonance frequency and/or amplifier non-linear distortions. High sensitivity to the self-oscillation signal allows preventing the amplifier from self-oscillation or limiting the level of oscillation. This provides the possibility of adding manual control of the FR correction level without the risk of loudspeaker system malfunction. High sensitivity to non-linear distortions of the amplifier can be of significant importance, for example, in portable equipment. When voltage on batteries drops, the level of undistorted output power decreases. At the same time, the limiting threshold of the FR correction level also decreases. Sensitivity to non-linear distortions can be additionally increased using HPF installed before the rectifier.

Since feedback circuits have transfer factor from the amplifier output to input which is much lower than 1, the elements X131 and X141 with the variable transfer factor in circuits of FIGS. 13 and 14 do not require compulsory signal amplification. These can be passive voltage dividers, for example, those based on a field transistor, a fiberoptic device or a divider controlled by a digital signal. Active devices with controllable amplification factor can also be used.

Figure 15:
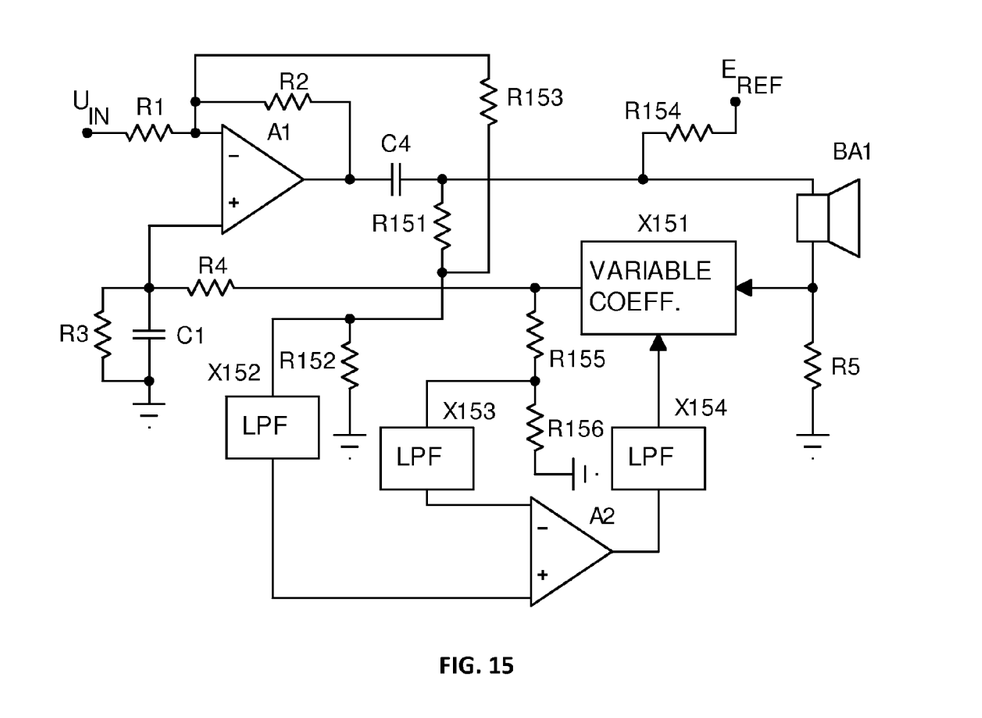
FIG. 15. A diagram of automatic control as per radiator active impedance.

Since the nature of the dynamic radiator impedance at the resonance frequency is close to active one, the determining value for the current through load PFB depth is the radiator active impedance. A slight change in the active impedance (which is, for example, caused by a change of the voice coil temperature) can be taken into consideration at the amplifier design stage. At the same time, if the amplifier is not designed for operation with a certain loudspeaker system, connection of loads with different impedances (e.g. 4-6-8 ohm) can influence FR significantly. The simplest solution to this problem is the use of manual switch of NFB or PFB depth. A more sophisticated solution is automatic tuning according to the radiator active impedance. The diagram where this idea is implemented is shown in FIG. 15. Here, the radiator BA1 is included into the arm of the bridge of the resistors R151, R152, R5. Low direct current can be supplied through this bridge through the resistor R154 which does not have any significant impact on the operation of the loudspeaker system. The control signal is generated by the differential amplifier A2. LPF X152, X153, X154 extract the steady component of the bridge signal. The bridge comprises an element with the controllable transfer factor X151. This element can be connected to any bridge arm (connection to the PFB circuit is shown in the diagram). The divider R155, R156 adjusts the bridge signal considering that there is one more NFB loop through the resistor R2. The direct current control loop provides bridge balancing. At the same time, constant ratio of the general NFB to PFB is maintained. As a result, the amplifier FR has little dependence on the load active impedance. The capacitor C4 can be absent in the diagram of FIG. 15, while another solution can be used to obtain the required FR provided in this description. Low direct current through the load can be obtained by means of setting a low offset voltage at the amplifier output.

Correction level limiting with an increase in the radiator active impedance due to heating of the voice coil can be another problem of regulation for the active impedance of the load. A control threshold (for example, increase in the impedance by 20%) can be set. When this threshold is exceeded, correction level limiting starts by means of decreasing the PFB depth and/or increasing the NFB depth.

The provided methods of adaptation of the correction level according to the load impedance and reduction of the correction level in case of the voice coil heating can be combined in a digital circuit. For this purpose, the minimum load impedance is calculated and the required correction level is set for it. When the minimum impedance increases, the correction level is limited.

The diagrams of FIG. 13-15 comprise an element with adjustable transfer factor X131, X141 and X151 which is eventually used to control the NFB to PFB ratio. Therefore, one adjustable element can be controlled by more than one control signal and perform combined functions. Apart from those described above, this can be a signal for deep correction manual control or a signal limiting correction and/or amplification when switching power on and/or off.

Figure 16:
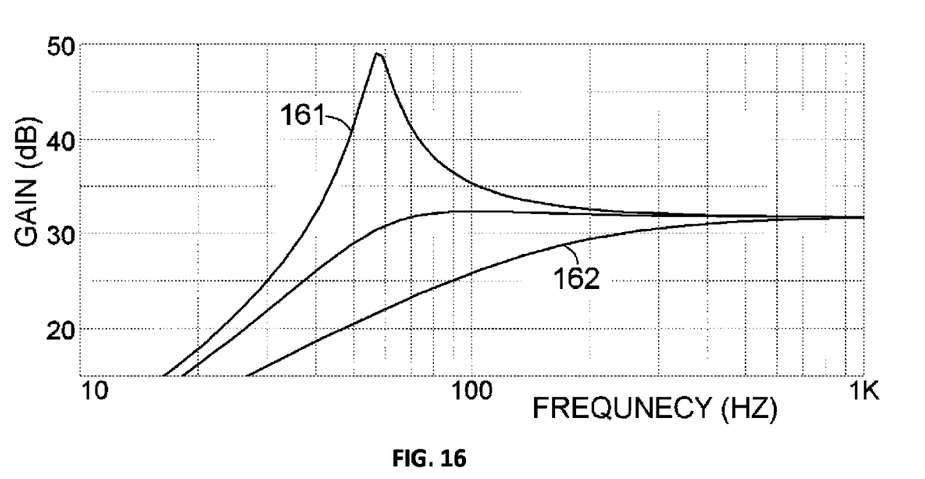
FIG. 16. Amplifier FR when adjusting with limitation of the low frequency signal at high output power.

The example of embodiment in FIG. 14 shows that when the PFB loop is broken, it is a normal amplifier with a capacitor at the input. If it is required to extend the range of reproducible frequencies of the loudspeaker system when the amplifier is designed, the selected cutoff frequency of the input capacitor HPF should be lower than the cutoff frequency of the loudspeaker system. Along with that, the claimed invention allows solving another problem: significant extension of the range of reproducible low frequencies at medium power of the output signal and substantial limitation of low frequencies at maximum output power. Technical effects of this solution can comprise efficient use of low power radiators. A band-pass filter in its typical embodiment is a combination of HPF and LPF. The invention allows selecting the HPF cutoff frequency much higher than the LPF cutoff frequency (ten times or more). The amplifier resonance frequency corresponds to the band-pass filter phase balance frequency which is in this case much lower than the HPF cutoff frequency. This control is illustrated by amplifier FR graphs in FIG. 16. Here, the curve 161 corresponds to the maximum PFB depth at the medium level of the output signal. The curve 162 corresponds to the minimum PFB depth at the maximum power of the output signal. The diagram of the amplifier which embodies such control does not differ from those provided above (it is only the matter of selection of filter cutoff frequency). The adjustable element can be in the PFB and/or NFB circuit. The output signal, difference between input and output signals, signal proportional to active impedance of the load, or any combination of these signals can be used as the control signal.

The invention claimed is:

1. An amplifier loaded onto an electro-acoustic transducer comprising:
    an amplifying element,
    a positive feedback loop which comprises a low-pass filter,
    the amplifier comprises one or more elements with frequency dependent characteristics which allows forming a bandpass filter,
    the medium frequency of said bandpass filter is significantly lower than the cutoff frequency at low frequencies as per sound pressure,
    said bandpass filter provides a rise of the amplifier frequency response in order to provide substantial increasing the level of reproduction of said electro-acoustic transducer at frequencies lower than the cutoff frequency at low frequencies and
    feedback parameters have been selected based on sufficient stability at low frequencies,
    wherein the signal proportional to current through a load is used as the signal of said positive feedback,
    wherein the voltage on a resistor which is connected in series with said load and has a value significantly lower than the load impedance is used as the signal of said positive feedback,
    wherein said load is a part of a bridge connection whose one arm consists of said load and said resistor of current positive feedback and the other arm consists of the voltage resistive divider,
    low direct current is supplied through said bridge connection which allows extracting the signal proportional to the load active impedance,
    the extracted signal of bridge direct current is used for adjustment of the feedback depth.

2. The amplifier of claim 1 wherein the positive feedback depth is decreased with increase in the load active impedance due to its heating.

3. The amplifier of claim 1 wherein direct current self-balancing of the bridge is used for adaptation of said correction of the amplifier frequency response according to the load active impedance.

4. The amplifier of claim 1 wherein said extracted signal of the bridge direct current is used in digitized form and digital signal processing is used to produce said frequency response.

* * * * *